(12) United States Patent
Gohel et al.

(10) Patent No.: US 8,988,081 B2
(45) Date of Patent: Mar. 24, 2015

(54) DETERMINING PROPAGATION DELAY

(75) Inventors: Tushar K. Gohel, Winchester, MA (US); Brandon Thorpe, Boston, MA (US)

(73) Assignee: Teradyne, Inc., North Reading, MA (US)

( * ) Notice: Subject to any disclaimer, the term of this patent is extended or adjusted under 35 U.S.C. 154(b) by 416 days.

(21) Appl. No.: 13/286,694

(22) Filed: Nov. 1, 2011

(65) Prior Publication Data

US 2013/0106399 A1    May 2, 2013

(51) Int. Cl.
G01R 27/28    (2006.01)
G01R 35/00    (2006.01)
G01R 31/11    (2006.01)

(52) U.S. Cl.
CPC .............. *G01R 35/005* (2013.01); *G01R 31/11* (2013.01)
USPC ........ 324/617; 324/76.77; 324/533; 324/642; 327/74

(58) Field of Classification Search
CPC ............. G01R 31/31725; G01R 31/11; G01R 31/31937
USPC ..................... 324/617, 76.77, 76.54, 637–648
See application file for complete search history.

(56) References Cited

U.S. PATENT DOCUMENTS

| | | | | |
|---|---|---|---|---|
| 4,135,397 A * | 1/1979 | Krake | ........................ | 73/290 R |
| 4,734,637 A | 3/1988 | Chen et al. | | |
| 4,858,208 A * | 8/1989 | Swapp | ........................ | 368/118 |
| 5,321,632 A | 6/1994 | Otsuji et al. | | |
| 5,867,030 A * | 2/1999 | Sato | ........................ | 324/617 |
| 6,262,602 B1 | 7/2001 | Draving | | |
| 6,366,115 B1 * | 4/2002 | DiTommaso | ........................ | 326/32 |
| 6,563,352 B1 | 5/2003 | Gohel et al. | | |
| 6,625,206 B1 | 9/2003 | Doblar | | |
| 6,894,505 B2 | 5/2005 | Gohel | | |
| 7,388,657 B2 * | 6/2008 | Abbott | ........................ | 356/73.1 |
| 7,395,479 B2 | 7/2008 | Gohel et al. | | |
| 7,420,375 B2 | 9/2008 | Gohel | | |
| 8,310,270 B2 | 11/2012 | Gohel et al. | | |
| 2004/0056666 A1 | 3/2004 | Gohel | | |
| 2004/0232919 A1 * | 11/2004 | Lacey | ........................ | 324/533 |
| 2005/0146320 A1 | 7/2005 | Gohel | | |

(Continued)

FOREIGN PATENT DOCUMENTS

WO    WO 2009/079789    7/2009

OTHER PUBLICATIONS

PCT Notification of Transmittal of International Search Report and Written Opinion of International Searching Authority from International Application No. PCT/US2012/056228, dated Feb. 28, 2013, 11 pages.

(Continued)

*Primary Examiner* — Huy Q Phan
*Assistant Examiner* — Dustin Dickinson
(74) *Attorney, Agent, or Firm* — Fish & Richardson P.C.

(57) ABSTRACT

Techniques for obtaining a propagation delay through first and second transmission lines having substantially equal propagation delays may include: providing a first signal to the first transmission line; providing a second signal to the second transmission line; detecting an incident edge of the first signal on the first transmission line; detecting a reflected edge of the second signal on the second transmission line; and determining the propagation delay based on times of detection of the incident edge and detection of the reflected edge.

34 Claims, 13 Drawing Sheets

(56) References Cited

U.S. PATENT DOCUMENTS

| | | |
|---|---|---|
| 2005/0193275 A1 | 9/2005 | Gohel |
| 2006/0161827 A1 | 7/2006 | Gohel et al. |
| 2009/0091347 A1 | 4/2009 | Gohel et al. |
| 2009/0174420 A1* | 7/2009 | Ariyama et al. ............... 324/754 |
| 2010/0176815 A1 | 7/2010 | Roth |
| 2012/0043994 A1* | 2/2012 | Alvarez Valenzuela et al. ............................... 327/82 |
| 2012/0106351 A1 | 5/2012 | Gohel et al. |
| 2012/0286898 A1* | 11/2012 | Chinn ........................... 333/139 |
| 2012/0319752 A1* | 12/2012 | Qu et al. ........................ 327/161 |
| 2013/0124134 A1 | 5/2013 | Gohel |

OTHER PUBLICATIONS

International Preliminary Report on Patentability mailed May 15, 2014 in international application No. PCT/US2012/056228, 8 pgs.

* cited by examiner

DETERMINING PROPAGATION DELAY

TECHNICAL FIELD

This disclosure relates generally to determining propagation delay through a transmission line.

BACKGROUND

Propagation delay in a transmission line corresponds to the time delay it takes for a signal to propagate from one end of the transmission line to another end of the transmission line. Time domain reflectometry (TDR) is one method of measuring propagation delay in a signal line. U.S. Pat. No. 4,734,637 describes a TDR implementation.

SUMMARY

This disclosure relates generally to techniques for determining propagation delay through a transmission line. In an example implementation, this disclosure relates to techniques for simultaneously determining the propagation delay through two transmission lines of equal delay by exciting both of the transmission lines simultaneously and using a difference in time between the excitation of the first transmission line and a reflection on the second transmission line. These features can reduce the amount of circuitry required to determine the propagation delay in certain applications.

Techniques for obtaining a propagation delay through first and second transmission lines having substantially equal propagation delays may comprise: providing a first signal to the first transmission line; providing a second signal to the second transmission line; detecting an incident edge of the first signal on the first transmission line; detecting a reflected edge of the second signal on the second transmission line; and determining the propagation delay based on times of detection of the incident edge and detection of the reflected edge.

The incident edge may be a first incident edge. The techniques may comprise: triggering a change in state of the first signal in response to the first incident edge; detecting a second incident edge of the second signal on the second transmission line; triggering a change in state of the first signal in response to the second incident edge; detecting a third incident edge of the first signal on the first transmission line; and identifying a period between the first incident edge and the second incident edge. The period may correspond to a fixed delay. Determination of the propagation delay may be based on a fixed delay.

The reflected edge may be a first reflected edge and the period may be a first period. The techniques may comprise: triggering a change in state of the first signal in response to the first reflected edge; detecting a second reflected edge of the second signal on the second transmission line; triggering a change in state of the first signal in response to the second reflected edge; detecting a third reflected edge of the first signal on the first transmission line; and identifying a second period between the first reflected edge and the second reflected edge. The second period may correspond to the fixed delay plus a value corresponding to the propagation delay. Determination of the propagation delay may be based on the first period and the second period.

The value corresponding to the signal propagation delay may be related to a multiple of the propagation delay. Determining the propagation delay based on the first period and the second period may comprise: obtaining a difference between the first period and the second period; and obtaining a quotient of the difference and a constant corresponding to the multiple of the propagation delay.

Detecting the first incident edge may comprise comparing the first incident edge to a first threshold, and detecting the second incident edge may comprise comparing the second incident edge to the first threshold. Detecting the first reflected edge may comprise comparing the first reflected edge to a second threshold, and detecting the second reflected edge may comprise comparing the second reflected edge to the second threshold.

The first threshold and the second threshold may have different values. The first threshold and the second threshold may be obtained from a same programmable source. The programmable source may comprise a DAC. Voltage from the programmable source may be provided to an FPGA.

The FPGA may perform the foregoing operations comprising: providing the first signal to the first transmission line; providing the second signal to the second transmission line; detecting the incident edge of the first signal on the first transmission line; detecting the reflected edge of the second signal on the second transmission line; and determining the propagation delay based on times of detection of the incident edge and detection of the reflected edge.

The foregoing techniques may also include generating clock pulses to trigger changes in state of the first signal. Generating the clock pulses may comprise: using a first logic path to generate clock pulses to control triggering of the change in state of the first signal in response to the first incident edge and the second incident edge; and using a second logic path to generate clock pulses to control triggering of the change in state of the first signal in response to the first reflected edge and the second reflected edge. Each of the first and second logic paths receives, as input, the first signal and the second signal. Output from the first logic path and the second logic path may be controlled by a control signal.

Generating the clock pulses may comprise: delaying the first signal to produce a first delayed signal, combining the first delayed signal with the first signal to produce a first clock pulse, delaying the second signal to produce a second delayed signal, combining the second delayed signal with the second signal to produce a second clock pulse, and outputting, as the clock pulse, a combination of the first clock pulse and the second clock pulse.

Generating the clock pulses may comprise: delaying the first signal to produce a first delayed signal, combining the first delayed signal with the first signal to produce a first clock pulse, delaying the second signal to produce a second delayed signal, combining the second delayed signal with the second signal to produce a second clock pulse, outputting, as a first output, a combination of the first clock pulse and the second clock pulse, delaying an inverted version of the first signal to produce a third delayed signal, combining the third delayed signal with the inverted version of first signal to produce a third clock pulse, delaying an inverted version of the second signal to produce a fourth delayed signal, combining the inverted version of second delayed signal with the fourth signal to produce a fourth clock pulse. outputting, as a second output, a combination of the third clock pulse and the fourth clock pulse, combining the first output with a first version of a control signal and the second output with a second version of the control signal to produce first and second combined outputs, respectively, and outputting, as the clock pulse, a logical combination of the first and second combined outputs.

The foregoing techniques may comprise: generating clock pulses to trigger changes in state of the first signal. Generating the clock pulses may comprise: using, to generate the clock pulses, a logic path that receives, as input, the first signal, the second signal, the first threshold, and the second threshold, where the first threshold and the second threshold control whether the clock pulses trigger change in state of the first signal in response to the first incident edge and the second incident edge or the first reflected edge and the second reflected edge.

Generating the clock pulses may comprise: using a multiplexer having control inputs corresponding to the first and second signals to output the clock pulses at times to trigger the changes in state.

Two or more of the features described in this disclosure, including in this summary section, may be combined to form embodiments not specifically described herein.

The systems and techniques described herein, or portions thereof, may be implemented as a computer program product that includes instructions that are stored on one or more non-transitory machine-readable storage media, and that are executable on one or more processing devices. The systems and techniques described herein, or portions thereof, may be implemented as an apparatus, method, or electronic system that may include one or more processing devices and memory to store executable instructions to implement the stated functions.

The details of one or more implementations are set forth in the accompanying drawings and the description below. Other features, objects, and advantages will be apparent from the description and drawings, and from the claims.

DESCRIPTION OF THE DRAWINGS

Like reference numerals in different figures indicate like elements.

DETAILED DESCRIPTION

Described herein is a system for obtaining a delay through transmission lines. In an example implementation, the system includes providing a first signal to a first transmission line; providing a second (e.g., complementary) signal to a second transmission line; detecting an incident edge of the first signal on the first transmission line; detecting a reflected edge of the second signal on the second transmission line; and determining the delay based on a time of detection of the incident edge and a time of detection of the reflected edge. In this example, both transmission lines have the same electrical delay length. Accordingly, the determined delay applies to both the first and second transmission lines. The first and second transmission lines may be, e.g., components of a differential transmission line.

In an example implementation, circuitry and logic is maintained, and thresholds are changed to toggle between measuring an oscillation period with no transmission line and an oscillation period with a transmission line. In another example implementation, a threshold may or may not be maintained but circuitry and logic are changed to toggle between measuring the oscillation period with no transmission line and the oscillation period with a transmission line.

Figure 1:
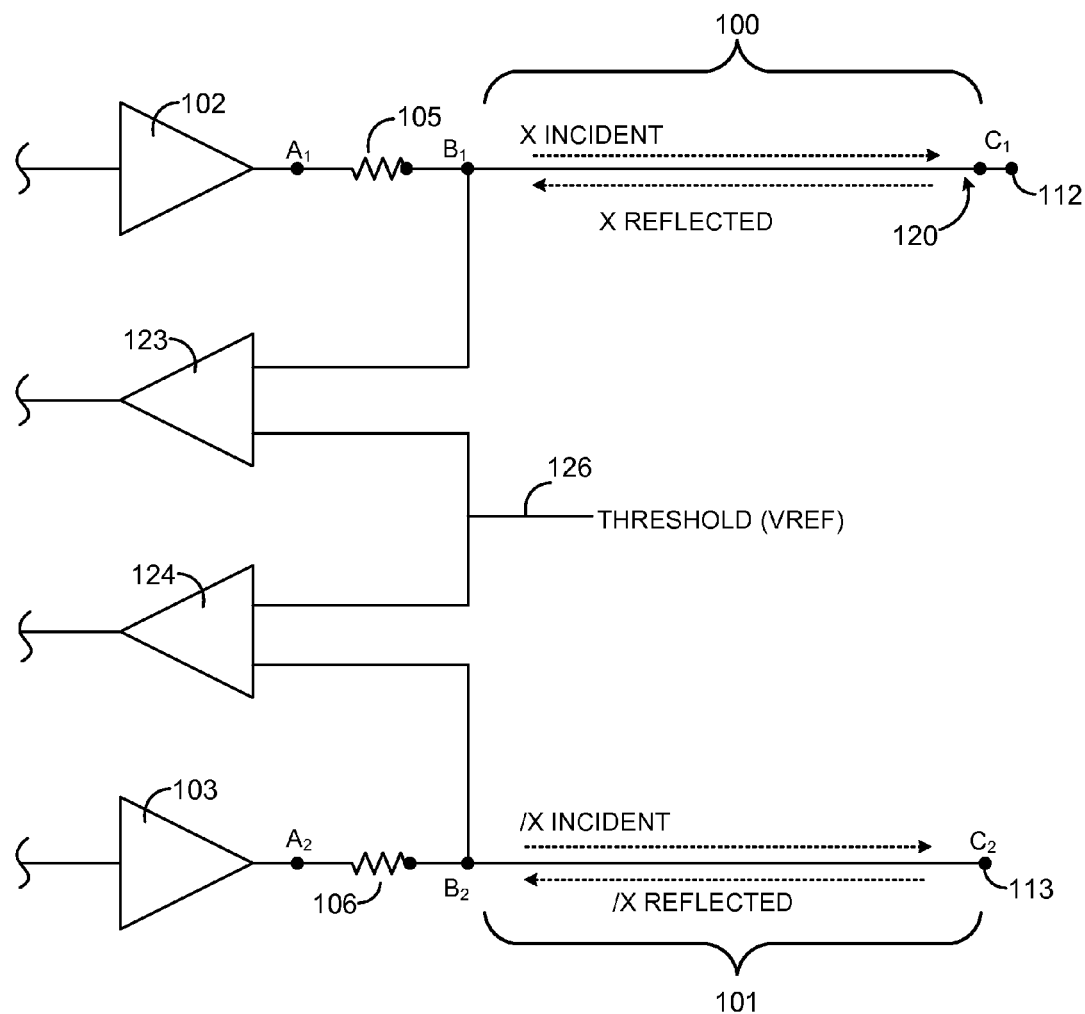
FIG. 1 is a diagram of an example of a channel connected to a transmission line.

FIG. 1 shows examples of first and second transmission lines 100 and 101, which may correspond, e.g., to first and second channels, respectively, of automatic test equipment. FIG. 1 also includes drivers 102, 103 and impedance 105, 106. In this example, drivers 102, 103 are single-ended drivers, and each impedance 105, 106 is represented as a resistor. However, any appropriate circuit element or elements may provide impedance. Transmission lines 100, 101 each also have characteristic impedance. This characteristic impedance is not depicted in FIG. 1. The characteristic impedance of each transmission line may have a value about equal to that of each corresponding impedance 105, 106.

Transmission lines 100, 101 terminate in reflective ends 112, 113. Reflective ends 112, 113 may be discontinuities, such as open circuits, or elements having sufficiently high impedance to reflect signals, or portions thereof, back through transmission lines 100, 101. The example implementations described herein include cases where reflective ends 112, 113 are discontinuities.

Transmission lines 100, 101 produce an inherent signal propagation delay, referred to here as "PD". Signal propagation delay, in this example, refers to the time it takes for a signal to travel the length of the transmission line in a single direction. Transmission lines 100, 101 have substantially the same electrical delay length and, therefore, about the same PD in the examples described herein. Accordingly, reflections in a different (e.g., complementary) transmission line can be used to determine PD in another transmission line, as described below.

In an example operation, driver 102 provides a signal, labeled X, to transmission line 100. That signal passes through impedance 105, down the length of the transmission line, and reflects at discontinuity 112 back towards driver 102. Driver 103 provides a signal, labeled /X, which is the complement of X, to transmission line 101 (complements may also be indicated by "+" and "−"). That signal passes through impedance 106, down the length of the transmission line, and reflects at discontinuity 113 back towards driver 103. X and /X are provided to their respective transmission lines at substantially the same time. As such, the propagation of the two signals is substantially complementary.

As shown in FIG. 1, points in transmission lines 100, 101 are labeled A ($A_1$ or $A_2$), B ($B_1$ or $B_2$), and C ($C_1$ or $C_2$). Taking X as an example, signal X is sent, by driver 102, down transmission line 100. In this example, X has values between 0V and 5V; however, this is only for example purposes, and any appropriate high and low voltage levels may be used. For example, 2.5V and 0V may be used for high and low voltage levels, respectively. At point $A_1$, signal X—the output of driver 102—has a value of 5V. This is because the signal has passed through little, or no, impedance. Accordingly, as shown in graph 200 of FIG. 2, the signal goes from 0V to 5V.

For the purposes of the examples described herein, the signal edges (e.g., 201) are shown as ideal. However, in actual implementations, signal level transitions (e.g., the incident and reflected edges of the signals) will not be immediate and will occur over a relatively short period of time.

At point $B_1$, the signal has passed through impedance 105. In this example, impedance 105 has a value that reduces the signal level at point B to about half of what the signal level was at point A. For example the impedance may be 50Ω. However, in other examples, the impedance may be different, and may reduce the signal level by more or less than half. Any appropriate impedance value may be used prior to point $B_1$. Since the signal output by driver 102 is 5V in this example, the voltage at point $B_1$ rises to 2.5V (i.e., half of the 5V output signal). This 2.5V value, as is the case for other voltages noted herein, is within an acceptable tolerance. This rise is depicted in graph 202. The distance between points $B_1$ and $A_1$ is small; e.g., the propagation delay is negligible. Edge 204 at $B_1$ is shown as incident at about the same time as the edge 201 at $A_1$. In implementations, however, there may be a negligible time difference between the edge at $A_1$ and the edge at $B_1$.

By contrast, edge 206 at $C_1$ occurs one propagation delay (PD) later than the edges at $A_1$, $B_1$. This is because it takes a time, PD, for the signal to travel length of transmission line 100. Due to signal reflection resulting from the discontinuity at $C_1$, the voltage at $C_1$ reaches 5V after one PD. More specifically, referring to FIG. 1, if one were to measure the voltage at a point 120 (e.g., just before $C_1$) prior to the reflection, that voltage would be 2.5V. However, the reflection at the discontinuity in transmission line 100 has an additive effect on the signal. As a result, following reflection, the voltage at, or just prior to, $C_1$ is 5V. This is depicted in graph 209.

The reflected signal travels back through transmission line 100 towards driver 102. At time 210 on graph 202, the reflected signal reaches point $B_1$. The reflected signal augments the existing voltage at $B_1$, thereby driving the voltage at $B_1$ from 2.5V to 5V, as shown in graph 202. Time 216 (between 204 and 210) is equal to about twice the propagation delay of transmission line 100. More specifically, the signal takes a time interval PD to reach point $C_1$, and about an equal amount of time to travel back from $C_1$, following reflection, to reach $B_1$. Thus, in this example, at time 210 (e.g., 2PD from the initial state transition), the voltage at B1 is 5V.

Figure 2:
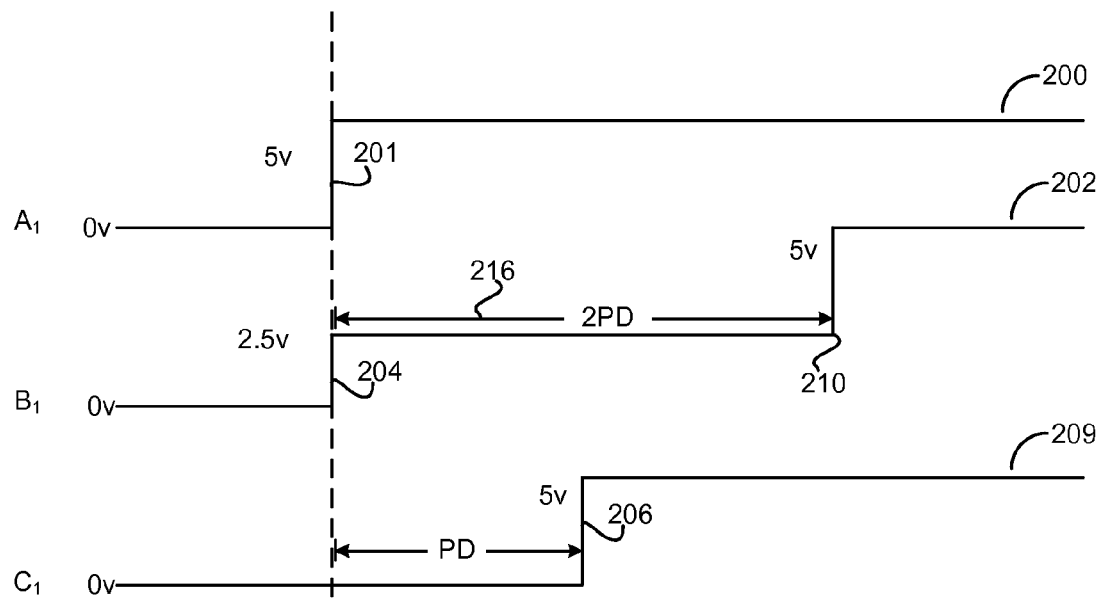
FIGS. 2 and 3 are graphs depicting example signal voltage levels on a transmission line terminated with an open circuit or high impedance.
Figure 3:
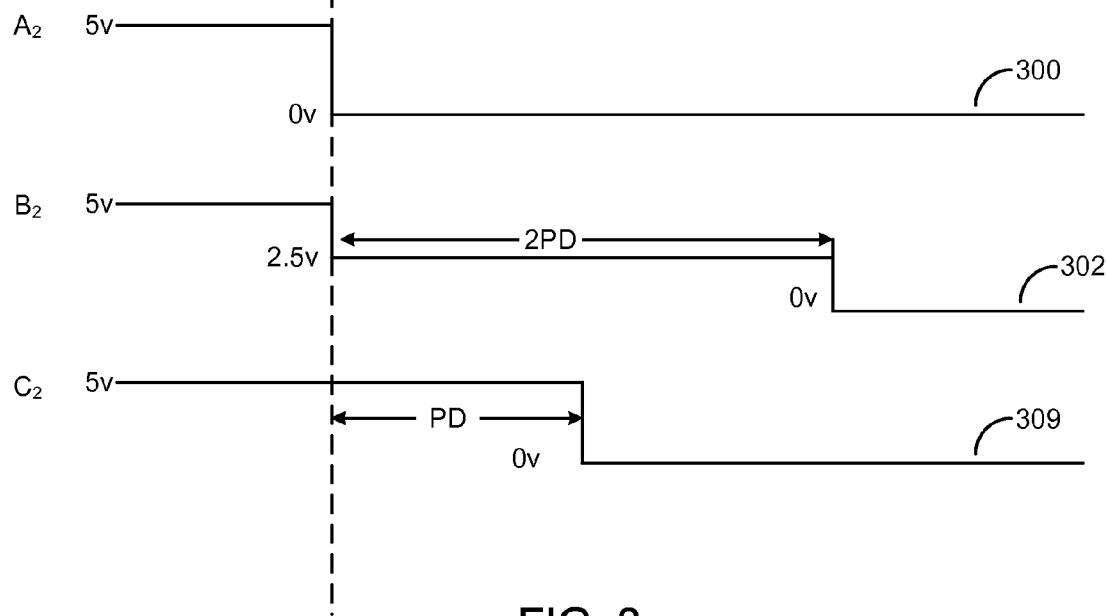

The effect is similar for complementary signal /X on transmission line 101. However, for the complementary signal, the graphs depicted in FIG. 2 are inverted. For example, FIG. 3 shows an example graph 300, which is similar to graph 200, and a resulting graph 302 corresponding to the effect at $B_2$ of providing /X to the transmission line 102. As shown, in graph 302 for /X, the voltage at $B_2$ goes from 2.5V to 0V, which is the opposite result of graph 202, in which the voltage at $B_1$ goes from 2.5V to 5V. However, the time that it takes for $B_2$ to go from 2.5V to 0 is about the same as the time that it takes for the voltage at $B_1$ to go from 2.5V to 5V, namely 2PD.

The forgoing effects may be used in determining the propagation delay (PD) through transmission lines 101 and 102. For example, referring to FIG. 1, single-ended detectors 123, 124 (e.g., comparators) receive signals from their respective transmission lines 100, 101, along with a voltage threshold 126. In this example, the threshold is a single voltage value that is compared to the signals from the transmission lines in order to determine PD in the manner described below. In this regard, in some example implementations, the circuitry described herein may be implemented, at least in part, on a field programmable gate array (FPGA). For example, the circuitry, including the drivers and detectors, may be in the FPGA. The FPGA may receive the threshold voltage from an external digital-to-analog converter (DAC). The FPGA may have a single pin dedicated to provide a threshold voltage. This threshold voltage may be programmable (e.g., it may be changed), as described below. In other implementations, the circuitry described herein may be implemented outside the context of an FPGA using threshold voltages, e.g., from different voltages of pins or other sources.

Figure 4:
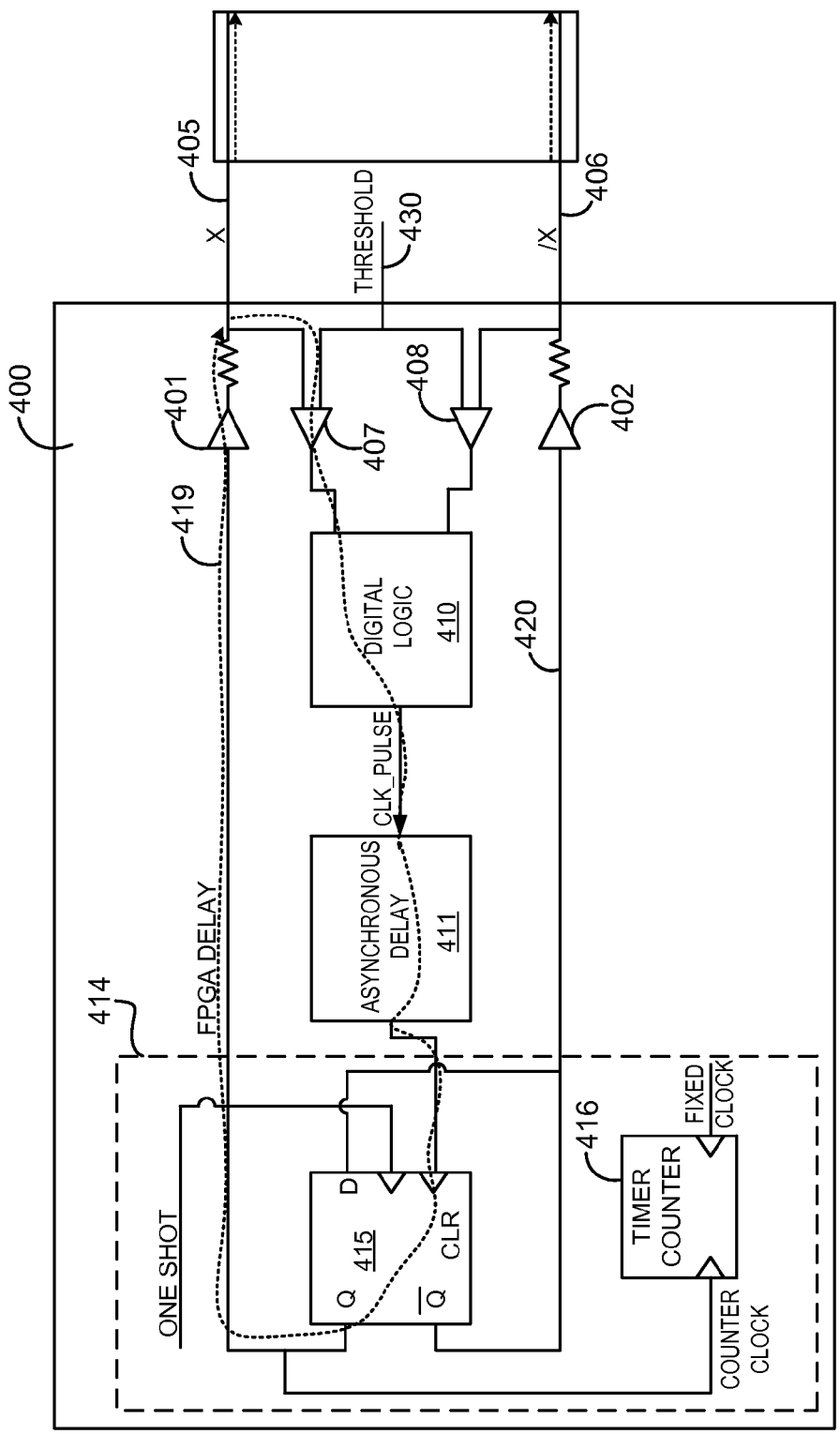
FIG. 4 is block diagram of an example FPGA implementation for determining a propagation delay through transmission lines.

In an example FPGA implementation, the FPGA has an associated delay, which is referred to as the FPGA delay. FIG. 4 shows an example FPGA 400 which includes drivers 401, 402 for outputting signal edges to transmission lines 405, 406 (e.g., the equivalent of transmission lines 100, 101), comparators (e.g., detectors) 407, 408 for comparing signals on those transmission lines to a reference voltage (e.g., a threshold voltage 430); digital processing logic 410 (e.g., for generating a clock signal and/or determining propagation delay according to the processes described herein), asynchronous delay circuit 411, and a signal generation circuit 414, which, in this example, is a flip-flop 415. Timer counter 416 counts the number of times the output of flip-flop 415 toggles over a fixed period of time. The FPGA delay may result, e.g. from signal propagation shown by dotted line 419.

In implementations that involve circuitry other than an FPGA, similar concepts apply. Proceeding with the FPGA example, the FPGA delay is fixed by device; however, its exact value need not be known. The FPGA delay, however, is at least twice PD in the implementations described herein. This constraint may be set, e.g., to allow for reflections to propagate without interference from subsequently-provided signal edges. At least part of the FPGA delay may be programmed into the FPGA, e.g., by asynchronous delay circuit 411. Since PD is not known, the FPGA delay may be programmed to a value that is expected to be at least, or exceed, 2PD. In some example implementations, the FPGA delay may be programmed, e.g., to 60 nanoseconds (ns), 70 ns, 150 ns, and so forth. It is noted that these values are examples only, and that the FPGA delay may take on any appropriate value given the length of the transmission lines at issue.

In an example implementation, the processes described herein obtain first information based on a rising incident signal edges, taking into account the FPGA delay. The processes obtain second information based on a rising reflected signal edges, which takes into account both the FPGA delay and the signal propagation delay (PD) across the length of the transmission lines. The processes use the first information and the second information to remove the FPGA delay, leaving information on PD which, in the example implementation described herein, is a multiple of PD. Since the FPGA delay is removed from the determination, its actual value need not be known, as noted above.

Figure 5:
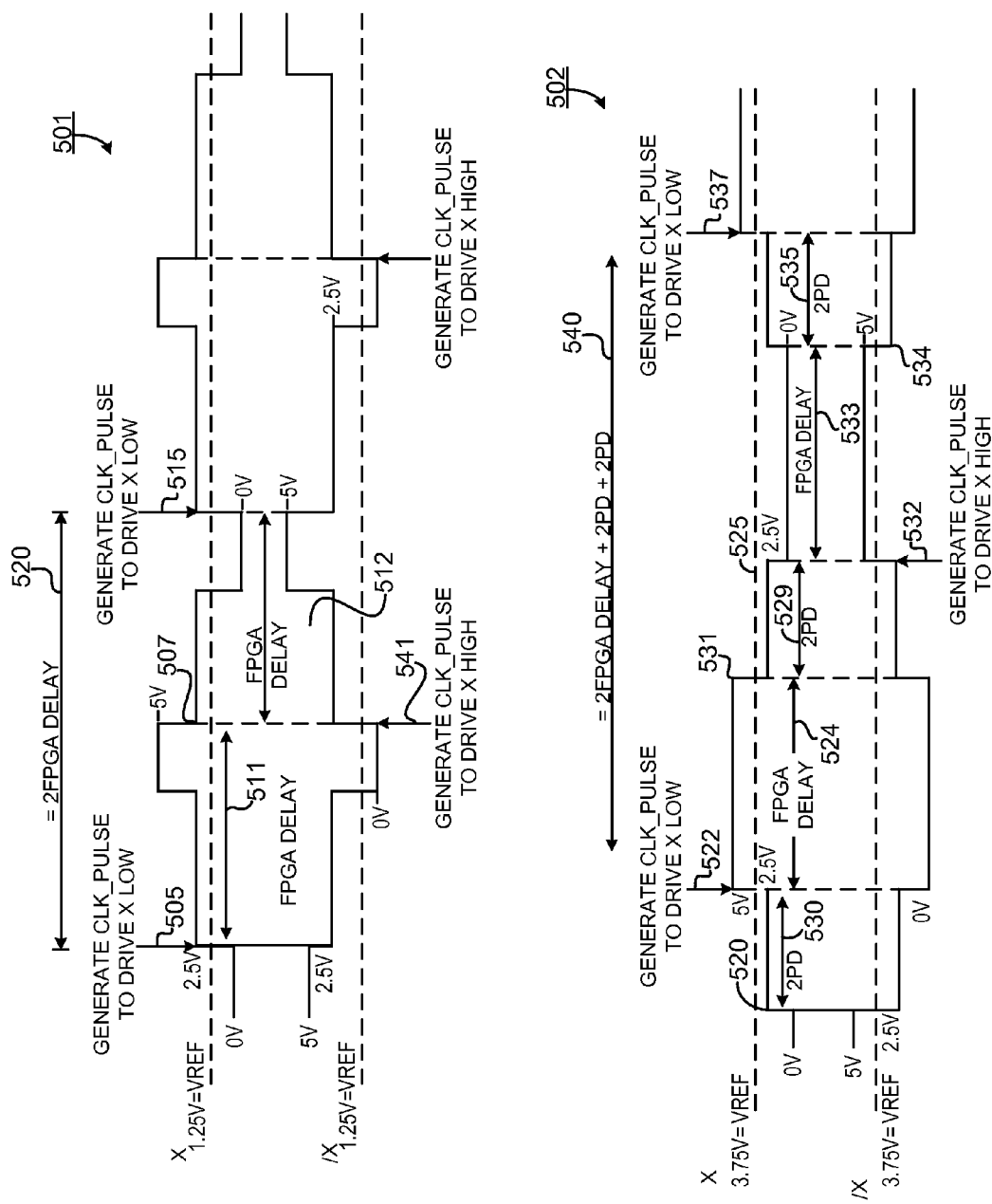
FIG. 5 shows graphs depicting examples of trigger points for clock pulses used for determining a propagation delay through transmission lines.

Reference is made to FIG. 5 to illustrate the example implementation explained above. FIG. 5 shows two graphs 501, 502. In this example, both graphs are of voltage measurements at a point B of FIG. 1. For example, referring back to FIGS. 1 to 3, signal X of graph 202 may be measured at $B_1$, and complementary signal /X of graph 302 may be measured at $B_2$. For the sake of illustration, the voltage input to transmission lines X and /X has a minimum value of 0V and a maximum value of 5V. However, any appropriate voltage levels may be used in other implementations.

In graph 501, a threshold voltage (VREF in FIG. 5) is programmed to 25% of the maximum voltage. Here, that threshold voltage is 1.25V. This threshold is an example only, and other appropriate thresholds may be set. The threshold is used to trigger a clock to drive X and /X from high to low or low to high—generally, to change their current state.

A signal generator, such as signal generator 414 of FIG. 4, may be used to provide X and /X to the transmission lines. In the course of operation, X is driven high. In this example, that means that X goes from 0V to 5V. At about the same time, /X is driven low. In this example, that means that /X is driven from 5V to 0V. As shown in graph 501, for reasons explained above with respect to FIG. 5, driving X high and driving /X low at 501 causes the voltage of X at B1 to go from 0V to 2.5V (half the maximum) and the voltage of /X at B2 to go from 5V to 2.5V (also half the maximum).

In this example, the incident edge is marked by the rising edge of either X or /X crossing the threshold. The rising edge of X crosses the threshold (25%, 1.25V) at time 505. By contrast, at time 505, /X has not crossed the threshold. More specifically, although both signals are at 2.5V, triggering is caused by the rising edge of a signal passing through the threshold. For X, the incident edge goes from 0V to 2.5V, thereby crossing the 1.25V threshold. By contrast, for /X, the incident edge goes from 5V to 2.5V without crossing the 1.25V threshold. Consequently, the trigger, in this example, is the incident edge of X, and not the incident edge of /X. The trigger, in this example, is used to generate a clock pulse (CLK_PULSE) to drive X low (e.g., from 5V to 0V). For example, a clock generator (e.g., implemented in digital logic 410 of FIG. 4) may identify this trigger and, in response, generate a clock pulse. The clock pulse may act as an instruction to a signal generator (e.g., 414) to drive X to its complementary state, e.g., from high (5V) to low (0V), but only after a specified period of time. In this example, the specified period corresponds to one FPGA delay 511. In other implementations, the clock generator may identify the trigger, and then generate a clock pulse to the signal generator one FPGA delay following the trigger. In either case, the effect is the same, e.g., the signal generator drives X to its complementary state, e.g., from high (5V) to low (0V), after one FPGA delay.

As shown in graph 501, between time 505 and time 507 (one FPGA delay), the voltage at point $B_1$ goes from 2.5V to 5V for reasons explained above. At time 507, the signal generator drives X low, e.g., to 0V. Meanwhile, at about the same time, the signal generator drives complementary signal /X high. At that point, /X is low (e.g., 0V). /X therefore goes from 0V to 2.5V while X goes from 5V to 2.5V. As shown in graph 501, at time 507: at $B_1$, X is at 2.5V, and at $B_2$, /X is at 2.5V. Although both signals are at 2.5V, triggering is caused by the incident edge of a signal passing through the 1.25V threshold, which in this case is the rising edge. For /X, the incident edge goes from 0V to 2.5V, thereby crossing the 1.25V threshold. By contrast, for X, the incident edge goes from 5V to 2.5V without crossing the 1.25V threshold. Consequently, the trigger, in this case, is the incident edge of /X, and not the incident edge of X. This is in contrast to the first triggering event described above.

As was the case above, the clock generator may identify this trigger and, in response, generate a clock pulse. The clock pulse may act as an instruction to the signal generator to drive X to its complementary state, e.g., from low (0V) to high (5V), but only after a specified period. In this example, the specified period corresponds to one FPGA delay 512. In other implementations, the clock generator may identify the trigger, and then generate a clock pulse to the signal generator one FPGA delay following the trigger. In either case, the effect is the same, e.g., the signal generator drives X to its complementary state, e.g., from low (0V) to high (5V), after one FPGA delay.

So, referring to graph 501, following an FPGA delay 512, X is driven high at time 515. Meanwhile, complementary signal /X is driven low. As explained above, The incident edge of X crosses the threshold (25%, 1.25V) at time 515. By contrast, at time 515, /X has not crossed the threshold. That is, for X, the incident edge goes from 0V to 2.5V, thereby crossing the 1.25V threshold. By contrast, for /X, the incident edge goes from 5V to 2.5V without crossing the 1.25V threshold. Consequently, the trigger, at time 515, is the incident edge of X, and not the incident edge of /X. This type of triggering produces oscillation that may proceed as shown in graph 501 so long as the signal generator continues to drive X in the manner described.

In this example, the trigger frequency in FIG. 5 corresponds to the difference between times that trigger X to go from a first state (e.g. 0V) to a second state (e.g., 5V). For example, the trigger frequency corresponds to the period 520 between time 505 and 515. As shown in FIG. 5, this period is twice the FGPA delay.

The foregoing oscillations are determined without regard to PD. More specifically, signal state changes are triggered by alternating incident edges of X or /X. The incident edges reach the threshold before augmentation by reflected signals. By contrast, in graph 502, the threshold is set so that the reflected edges of X and /X trigger signal state changes. The reflected edges include the sum of the voltage caused by the incident edge and voltage resulting from signal reflection. As was the case in graph 501, in this example, a single threshold is used to trigger signal state changes; however, in this example implementation, that threshold (VREF) has been reprogrammed to a different value than the value used in graph 501. In this example implementation, the threshold is 75% of the maximum voltage, or 3.75V. This is only an example of a threshold voltage; any appropriate threshold voltage may be used to trigger signal state changes on reflected signal edges. Furthermore, it is noted that the processes described herein do not require the first and second thresholds to be generated from a single programmable threshold. Rather, if available, the first and second thresholds may be obtained from different sources, e.g., different voltage sources, different pins of a circuit (e.g., different pins of an FPGA, if available), and so forth.

In the course of operation, as shown in graph 502, X is driven high. In this example, that means that X goes from 0V to 5V. At about the same time, /X is driven low. In this example, that means that /X is driven from 5V to 0V. As shown in graph 502, for reasons explained above with respect to FIGS. 1 and 2, driving X high and driving /X low causes the voltage at B1 to go from 0V to 2.5V (half the maximum) and the voltage at B2 to go from 5V to 2.5V (also half the maximum). In this case, the reflected edge of X does not cross the threshold at time 520 (since 2.5V does not exceed 3.75V). Rising edges of X and /X represent the reflected edge in this example. Meanwhile, for /X, its falling edge (not its reflected edge) goes from 5V to 2.5V. Consequently, at time 520, no trigger is generated. At time 522, however, the reflected edge of X exceeds threshold 525 (3.75V), thereby triggering the clock generator to generate a clock pulse. As noted above, the clock pulse may act as an instruction to the signal generator to drive X to its complementary state, e.g., from low (0V) to high (5V), but only after a specified period. In this example, the specified period corresponds to one FPGA delay 524. In other implementations, the clock generator may identify the trigger, and then generate a clock pulse to the signal generator one FPGA delay following the trigger. In either case, the effect is the same, e.g., the signal generator drives X to its complementary state, e.g., from low (0V) to high (5V), after one FPGA delay.

In the case of graph 502, the reflected edge of X exceeds the threshold (in this example 75%, 3.75) following reflection of X through the length of the transmission line. Since the signal had to travel the length of the transmission line and then return, the time the signal took for X to exceed the threshold is 2PD 530. Accordingly, at time 522 (after 2PD), the trigger is detected. Accordingly, at time 531, which corresponds to time 522+2PD+one FPGA delay, X is driven low, e.g., from 5V to 0V. At time 531, complementary signal /X is drive high (e.g., from 0V to 5V). The falling edge of X (not its reflected edge) crosses the threshold at time 531. However, the reflected edge of /X does not cross the threshold at time 531, since the reflected edge of /X has only reached 2.5V at time 531, and not the 3.75V threshold. Since no reflected edge has crossed the threshold, a signal state change is not triggered at time 531. The reflected edge of /X crosses the threshold at time 532. Consequently, a trigger is generated at time 532. As explained above, this trigger may result in driving X to its complementary state following one FPGA delay time period 533 at time 534 (e.g., from low to high: 0V to 5V). Likewise, at time 534, /X is driven to its complementary state (e.g., from high to low: 5V to 0V). As was the case above, it takes X 2PD 535 to reach the threshold 525 at time 537, whereafter the foregoing process may repeat. This type of oscillation may proceed as shown in graph 502 so long as the signal generator continues to drive X in the manner described herein.

In graph 502, the trigger frequency corresponds to the difference between times that trigger X to go from a first state (e.g. 0V) to a second state (e.g., 5V). For example, the trigger frequency corresponds to the period 540 between times 522, 537. As shown in graph 502, this period is a sum of twice the FGPA delay (524 and 533) and 4PD. The 4PD period is obtained by summing two 2PD periods 529 and 535.

Referring to graph 501, the period between times 505, 515 is twice the FPGA delay, or 2(FPGA delay). Referring to graph 502, the period between times 522 and 537 is a sum of twice the FGPA delay 2(FPGA delay) and 4PD. PD is therefore determined by subtracting the period obtained from graph 501, namely 2(FPGA delay), from the period obtained from graph 502, namely 2(FPGA delay)+4PD. The resulting difference is 4PD. Dividing this result by 4 provides the PD for the transmission lines, e.g., transmission lines 100, 101. Thus, it is possible to determine PD for a transmission line (e.g., transmission line 100 of FIG. 1) by driving signal edges on another transmission line (e.g., transmission line 101 of FIG. 2). After this delay is known, it can be compensated for, e.g., in an automatic test system, by using programmable delay elements.

Figure 6:
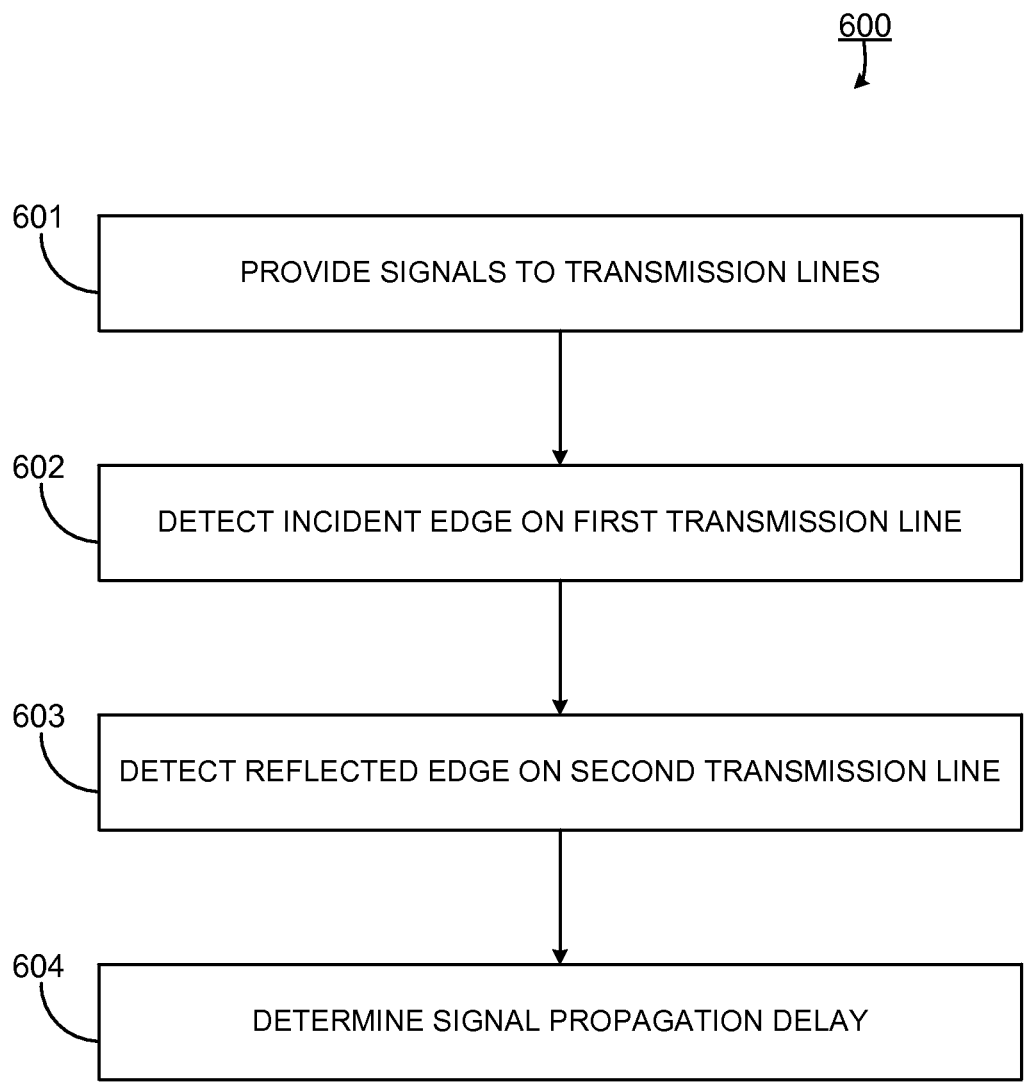
FIG. 6 is a flowchart of an example process for determining a propagation delay through transmission lines.

FIG. 6 shows an example process 600 for obtaining a delay through transmission lines, such as transmission lines 100, 101. According to process 600, a first signal (e.g., X) is provided to a first transmission line (e.g., transmission line 100), and a second signal (e.g., /X) is provided (601) to a second transmission line (e.g., transmission line 101). Process 600 detects (602) an incident edge on the first transmission line. This may be done, e.g., in the manner described above with respect to graph 501 (FIG. 5). Process 600 detects (603) a reflected edge of the second signal on the second transmission line. This may be done, e.g., in the manner described above with respect to graph 502 (FIG. 5). Process 600 determines (604) a signal propagation delay (e.g., PD) based on a time between detection of the incident edge and detection of the reflected edge. This may be done as explained above with respect to FIGS. 1 to 5.

Example implementations of a clock generator are as follows. These implementations of the clock generator are configured to generate clock pulses at the times specified, e.g., in graphs 501 and 502, to switch signal states.

Figure 7:
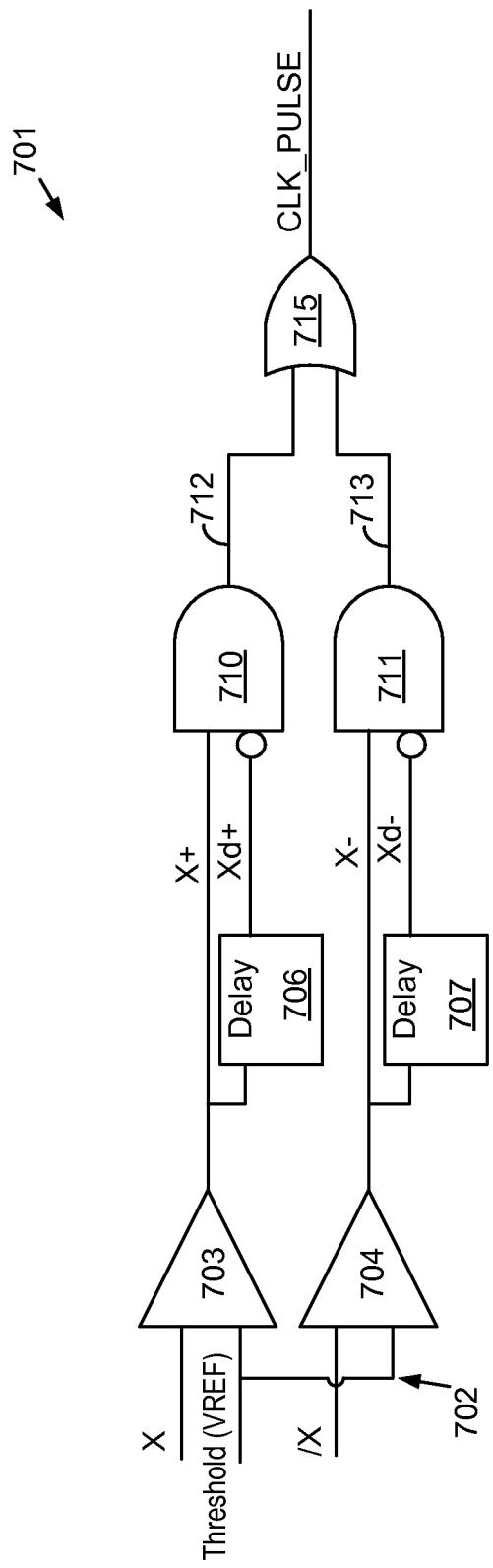
FIG. 7 shows logic for an example clock generator.

FIG. 7 shows an example implementation 701 of a clock generator that may be used to produce the clock pulses described herein. In the example implementation of FIG. 7, only the threshold VREF is changed to switch between toggling the output on the incident edge versus toggling the output on the reflected edge. More specifically, as shown in FIG. 7, a programmable threshold 702 (e.g., the same programmable threshold as in FIG. 5) is input to comparators 703, 704, along with a received "X" signal for comparator 703 and a received "/X" signal for comparator 704, which may correspond to signals detected on the respective transmission lines. The output X+ signal and the X− signal (signals generated from the inputs) are provided to delay elements 706, 707. Delay elements 706, 707 add a time delay to their respective signals to produce Xd+ and Xd−, respectively. In some implementations, the delay may be, e.g., 2 ns to 4 ns. These delays determine the pulse width of the clock pulse. Any appropriate delay may be added to the respective signals. The output of comparator 703 and the output of delay element 706 is provided to logic gate 710; and the output of comparator 704 and the output of delay element 707 is provided to logic gate 711. The outputs 712 and 713 of the respective logic gates are provided to OR gate 715, which generates the clock pulse (CLK_PULSE) in this implementation. In this example implementation, logic gates 710 and 711 are AND gates having one input inverted (e.g., the input, in each gate, received through the "circles" shown in the figures).

Figure 8:
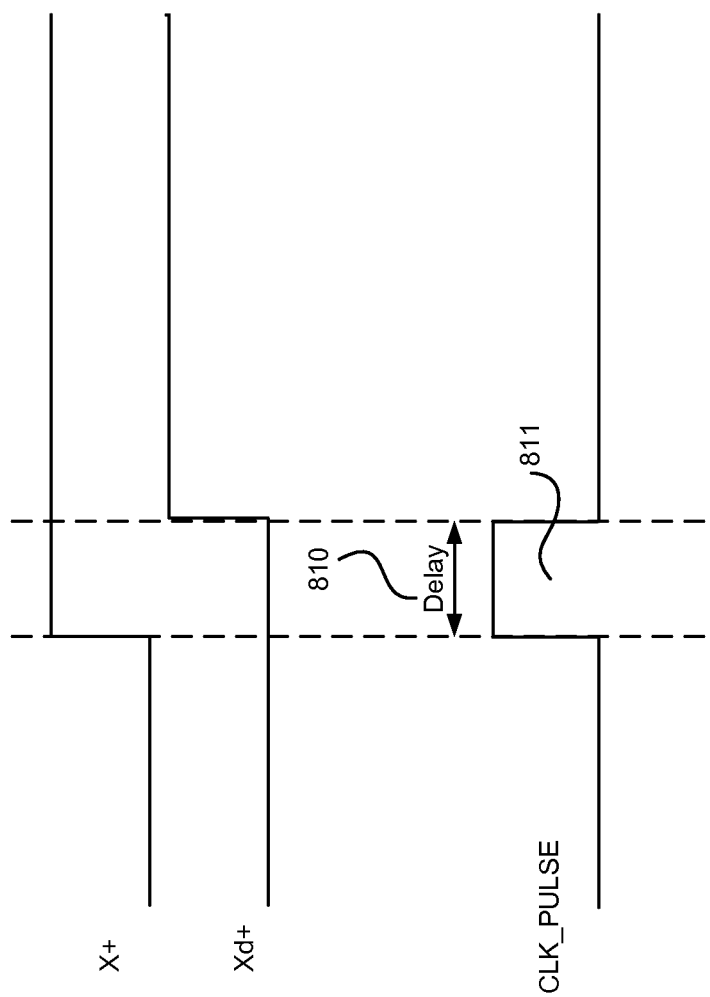
FIG. 8 shows graphs depicting an example process for generating a clock pulse using a delay element.

By way of example, the input to logic gate 710 may include values of X+ and Xd+, where Xd+ is a delayed version of X+ produced via delay element 706. A graph of these signals is shown in FIG. 8 for an input X signal transitioning from low to high. Logic gate 710 combines the two, producing a "1" output at region 810 (FIG. 8) for a time period. This "1" output corresponds to clock pulse (CLK_PULSE) 811 (FIG. 8). A similar output can produced for appropriate inputs of X− and Xd−.

As noted below, in some implementations, specific delay elements need not be used. For example, in FIG. 7, logic gates 710 and 711 can be standard AND gates (instead of AND gates with an inverted input, as pictured). Delay elements 706 and 707 can be removed and inverters substituted in their place. The result is an inverted input signal into one input of each AND gate. Furthermore, the inverters have an inherent delay which will still produce a delayed signal and result in a pulse, such as that shown in FIG. 8. However, the pulse width may be dependent on the inherent delay of the inverters that is imparted to the delayed signal rather than, e.g., the delay imparted by a programmed delay of a delay element.

The level of the threshold signal 702 input to comparators 703 and 704 determines whether the clocking is for the case where the transmission line length is taken into account when triggering transitions (e.g., graph 502 of FIG. 5) or for the case where the transmission line is not taken into account when triggering transitions (e.g., graph 501 of FIG. 5). For example, where the threshold is set low (e.g., for graph 501) comparator 703 detects a rising edge of signal X+ at time 505 of graph 501, thereby causing a pulse to be output at that time; and comparator 704 detects a rising edge of signal X− at time 541, thereby causing a pulse to be output at that time. Likewise, where the threshold is set high (e.g., for graph 502) comparator 703 detects a rising edge of signal X+ at time 522, thereby causing a pulse to be output at that time; and comparator 704 detects a rising edge of signal X− at time 532, thereby causing a pulse to be output at that time.

Figure 9:
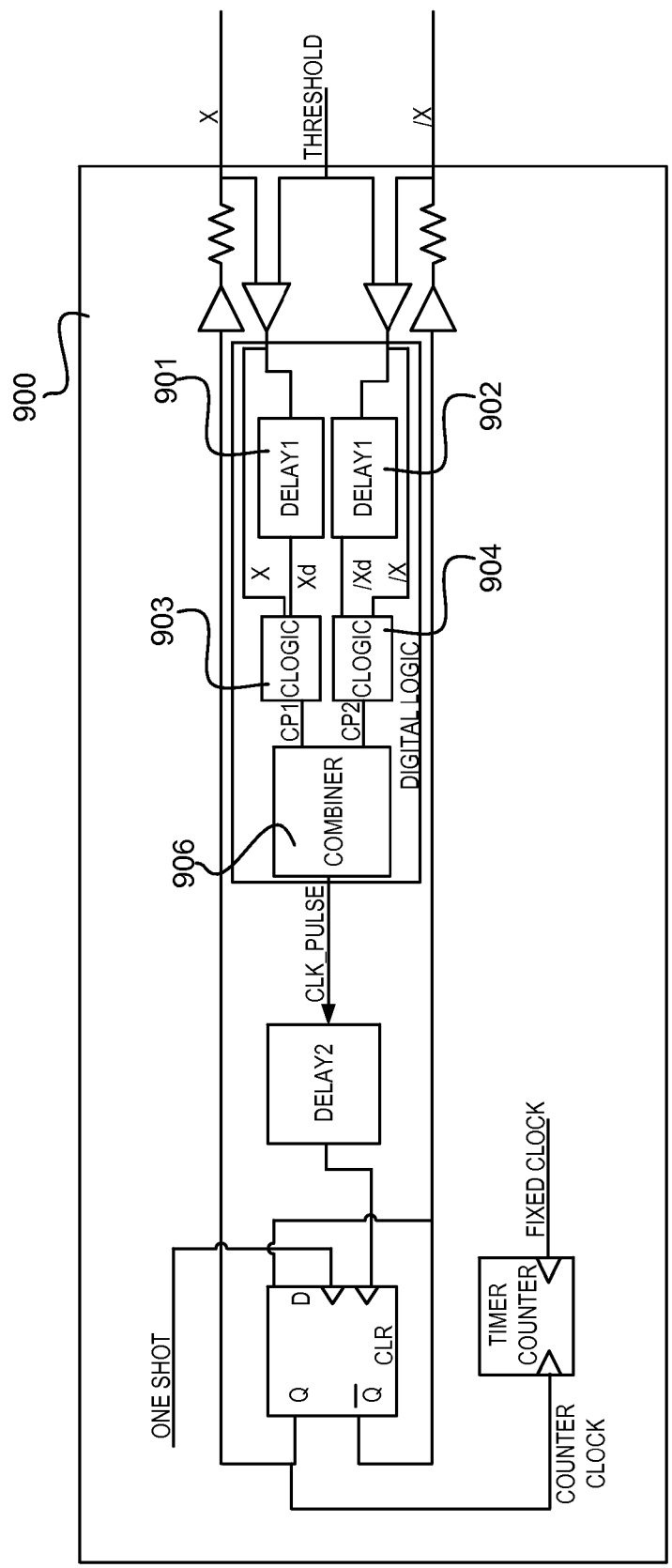
FIG. 9 is block diagram of another example FPGA implementation for determining a propagation delay through transmission lines.

FIG. 9 shows the foregoing clock generator implemented in an example FPGA 900. There, delays 706, 707 correspond to delay elements 901, 902, respectively; "Clogic" 903, 904 corresponds to logic gates 710, 711, and combiner 906 corresponds to OR gate 715. Implementations other than those depicted in FIGS. 7 and 9 may be used.

Figure 10:
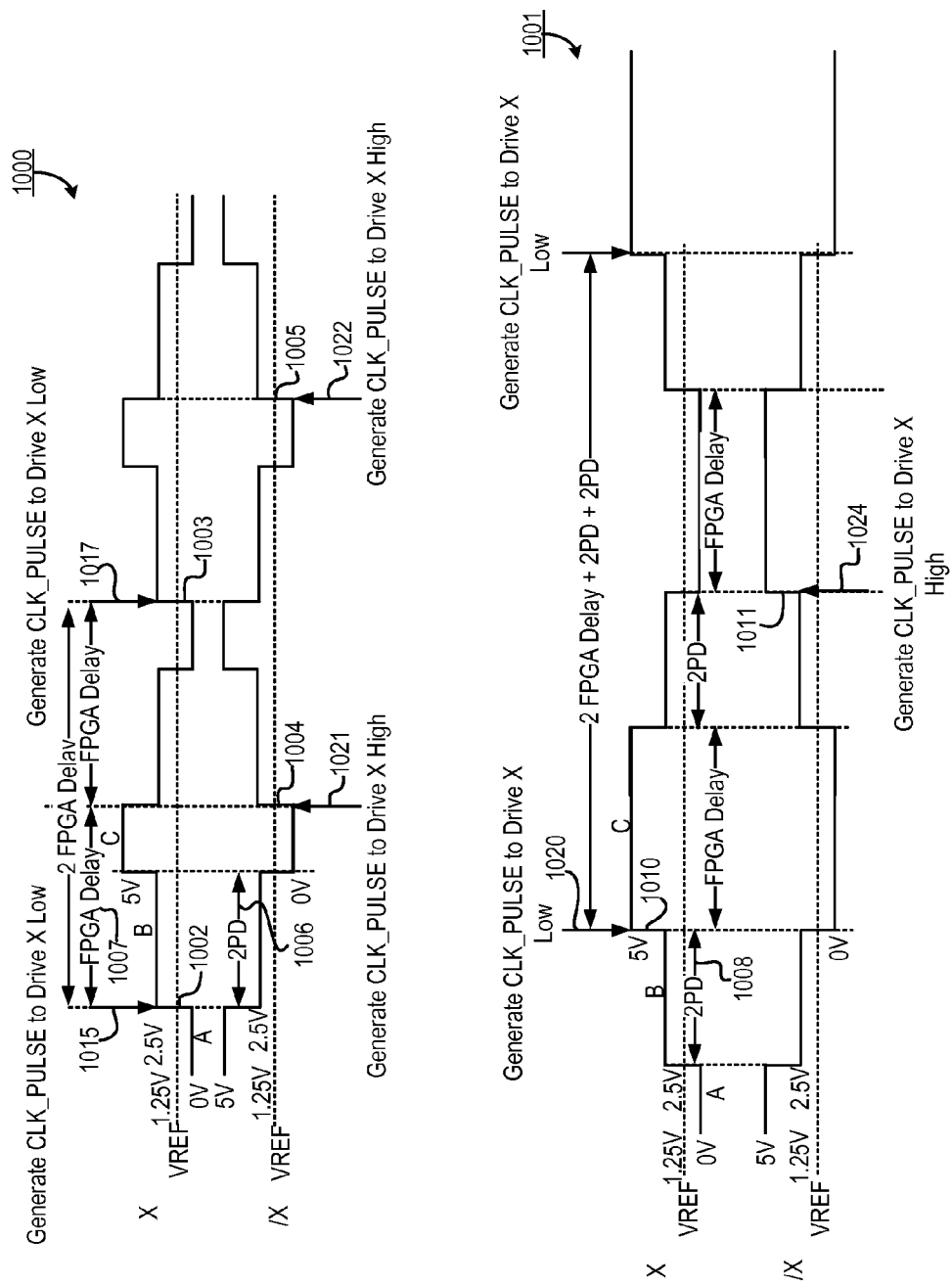
FIG. 10 shows example graphs for use in generating clock pulses with a fixed threshold.
Figure 11:
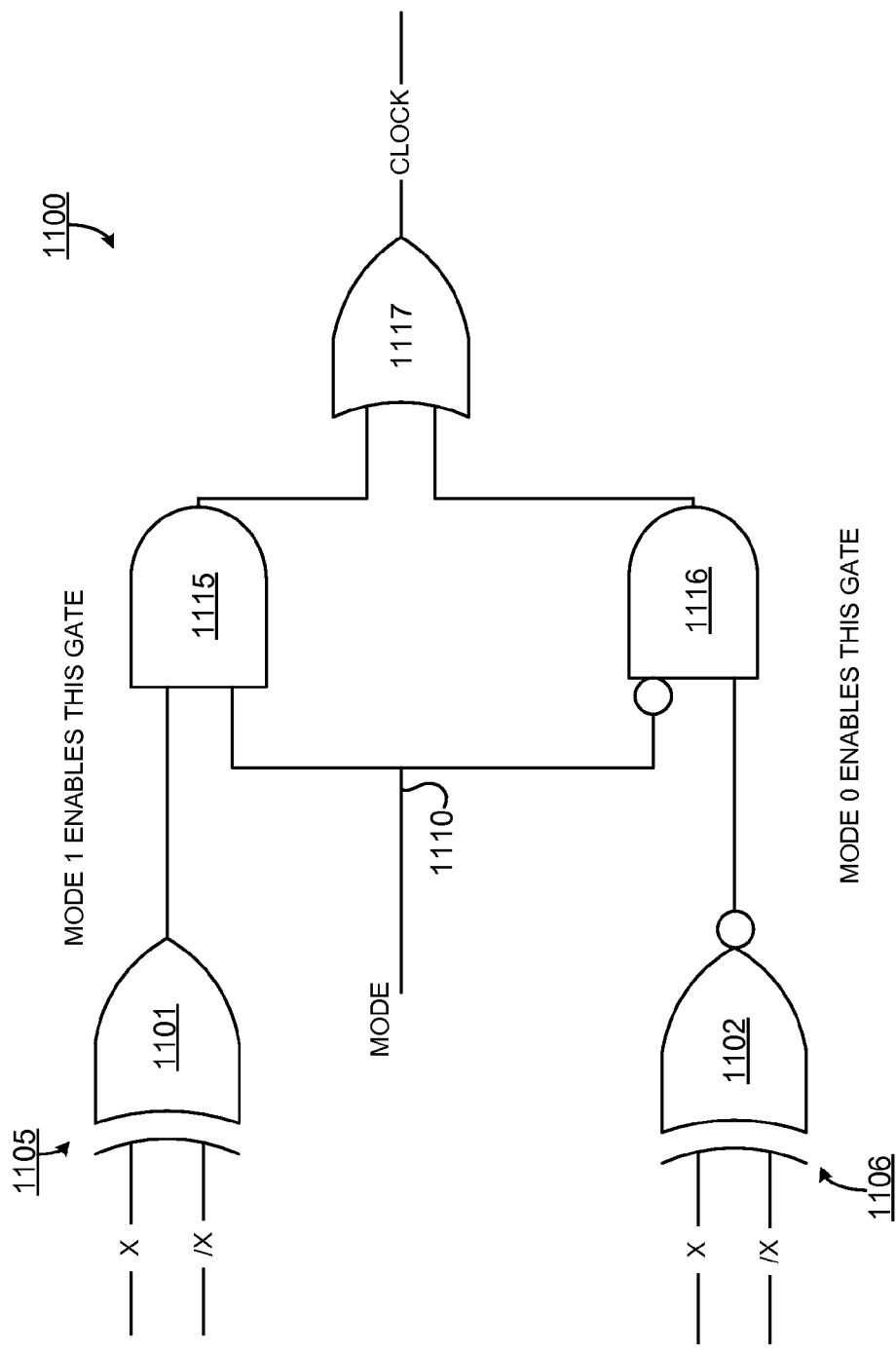
FIG. 11 shows logic for another example clock generator.

FIG. 11 shows another example implementation of a clock generator. First, however, referring to FIG. 10, graph 1001 is a counterpart of graph 1000 of FIG. 10 where the threshold VREF remains the same for both sets of measurements. In this example, that threshold remains at 1.25V. For reasons explained above, at edges 1002 and 1003 of an input signal X, signal state transition is desired in X (e.g., from low to high voltages). At edges 1004 and 1005 of the complementary signal /X, signal state transition is desired in /X (e.g., from low to high voltages). For reasons explained above, at edge 1010, signal state transition is desired in X (e.g., from low to high voltages), and at edge 1011, signal state transition is desired in /X (e.g., from low to high voltages).

Example clock generator logic 1100 of FIG. 11 may be used to produce the desired state transitions given signal inputs of X and /X. In this regard, logic 1100 includes an XOR gate 1101 and an XNOR gate 1102, each of which receives, at its input X and /X. The logic path 1105 containing XOR gate 1101 controls clocking for the case where the transmission line length is taken into account when triggering transitions (e.g., graph 1001 of FIG. 10); and the logic path 1106 containing XNOR gate 1102 controls clocking for the case where the transmission line is not taken into account when triggering transitions (e.g., graph 1000 of FIG. 10). A mode signal 1110 determines which path output is used to generate the clock pulse. In particular, if the mode signal is high (e.g. one), the XOR path 1105 is enabled and the XNOR path 1106 is disabled. If the mode signal is low, the XNOR path 1106 is enabled and the XOR path 1105 is disabled. AND gate 1115 and logic gate 1116 control the output from either XOR gate 1101 or XNOR gate 1102. OR gate 1117 receives the outputs of the gates 1115 and 1116, and generates the clock pulses therefrom.

Referring to graph 1000 of FIG. 10, XNOR gate 1102 receives the inputs of X and /X at areas A, B and C. Consequently, at time times 1015 and 1017, the XNOR output is 1 for X, resulting in a clock pulses to change the signal state of X. At time times 1021 and 1022, the XNOR output is 1, resulting in a clock pulses to change the signal state for /X. Referring to graph 1001 of FIG. 10, XOR 1102 gate receives the inputs of X and /X at areas A, B and C. Consequently, at time 1020, the XOR output is 1, resulting in a clock pulse to change the signal state of X. At time 1024, the XOR output is 1, resulting in a clock pulse to change the signal state of /X.

Figure 12:
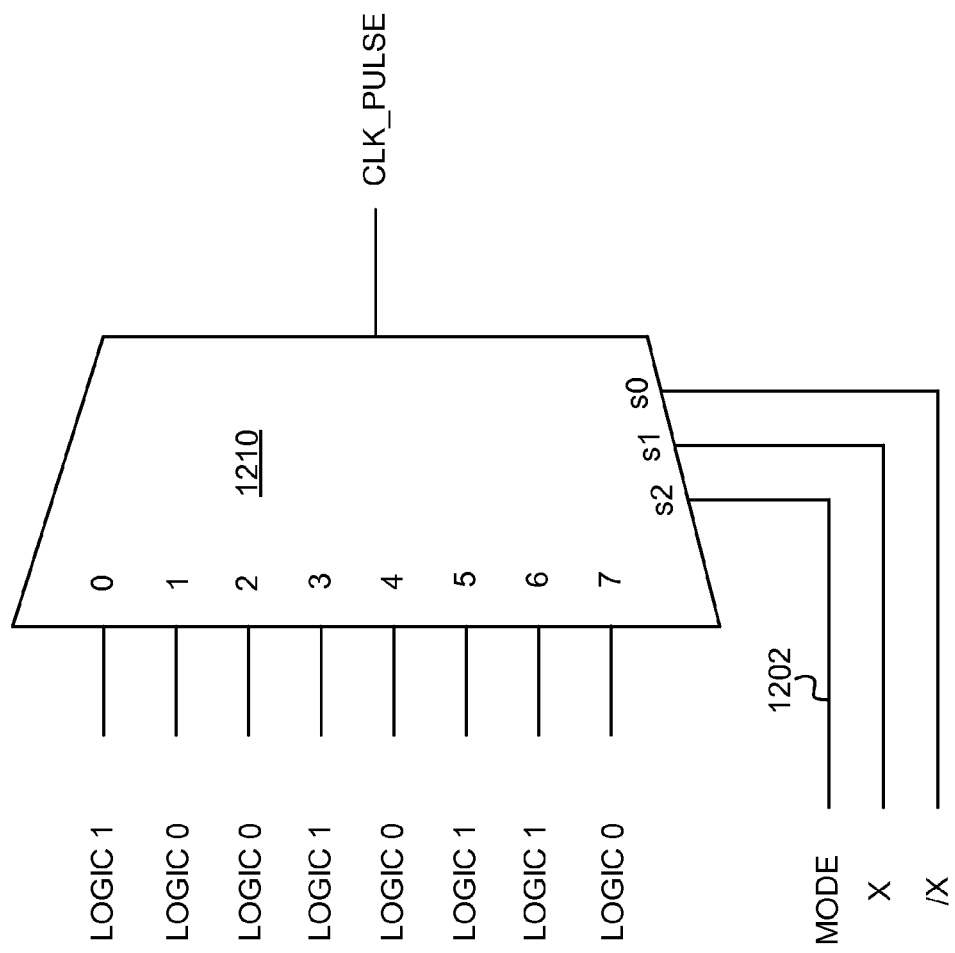
FIG. 12 shows circuitry for another example clock generator.

Referring to FIG. 12, in another example implementation, the clock generator may include a multiplexer 1210. The multiplexer receives a mode signal 1202 of "1" that controls clocking for the case where the transmission line length is taken into account when triggering transitions (e.g., graph 1001 of FIG. 10); and a mode signal of "0" that controls clocking for the case where the transmission line is not taken into account when triggering transitions (e.g., graph 1000 of FIG. 10). In this example, multiplexer 1210 receives the X and /X signals, and generates the clock output (CLK_PULSE) in accordance with the following truth table:

| Mode | X | /X | CLK_PULSE |
|---|---|---|---|
| 0 | 0 | 0 | 1 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 0 |

Figure 13:
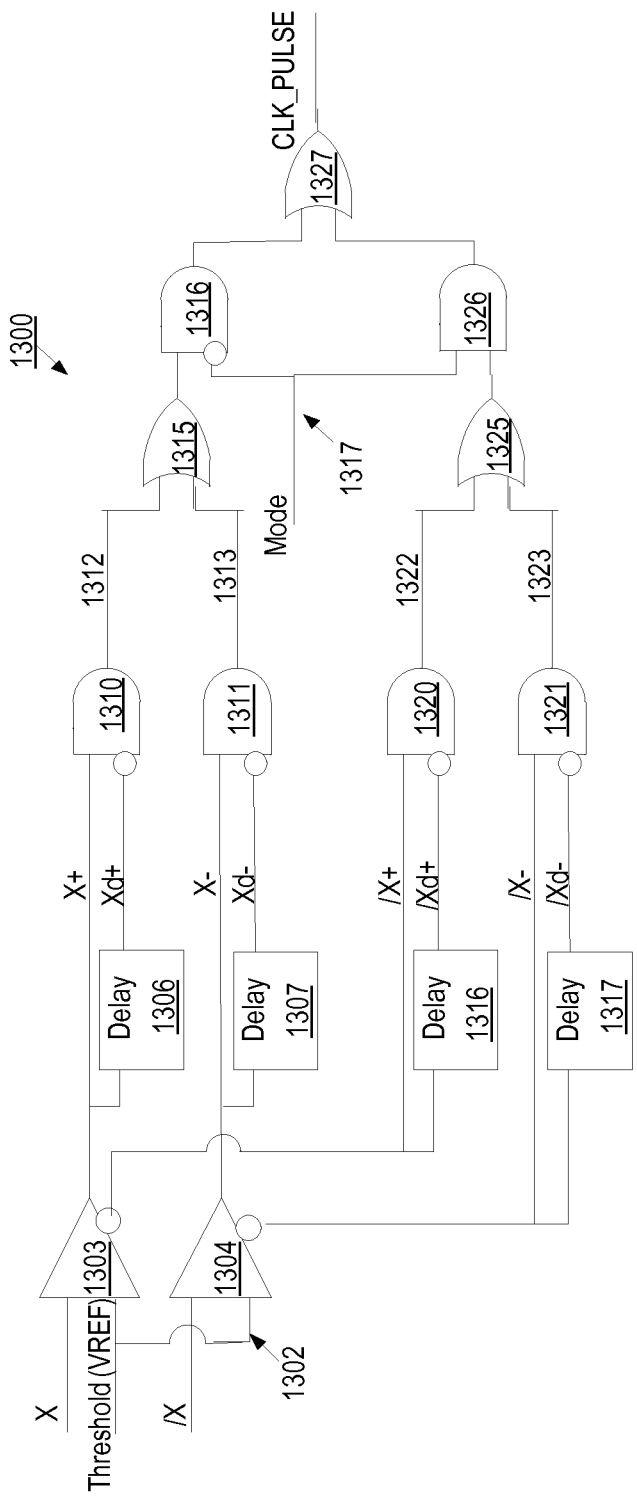
FIG. 13 shows logic for another example clock generator.

FIG. 13 shows an example implementation of a clock generator that allows for fixed thresholds as shown in FIG. 10, but that achieves a specified minimum pulse width for the clock. In the implementation of FIG. 13, an input signal "X" and an inverted version of the input signal "/X" are provided to comparators 1303 and 1304, respectively. The threshold (VREF) is also applied to those comparators. The output of comparator 1303 is provided to logic gate 1310 and to delay element 1306, and the inverted output of comparator 1303 is provided to logic gate 1320 and delay element 1316. The output of comparator 1304 is provided to logic gate 1311 and to delay element 1307, and the inverted output of comparator 1304 is provided to logic gate 1321 and delay element 1317. The configuration for each comparator output (normal or inverted) is similar to that provided in FIG. 7. Accordingly, the resulting outputs of logic gates 1310 and 1311 are applied to OR gate 1315; and the resulting outputs of logic gates 1320 and 1321 are applied to OR gate 1325. A mode signal 1317, or its inversion, is combined with the output of each OR gate 1315 or 1325 via respective logic gates 1316 and 1326, as shown. A mode signal 1317 determines which path output is used to generate the clock pulse. In particular, if the mode signal is high (e.g. one), the output of logic gate 1325 is passed through to OR gate 1327 and the output of logic gate 1315 is blocked. If the mode signal is low (e.g. zero), the output of logic gate 1315 is passed through to OR gate 1327 and the output of logic gate 1325 is blocked. In the example shown in FIG. 10, the logic path flowing through OR gate 1315 generates clock pulses corresponding to the signals in 1000. The logic path flowing through OR gate 1325 generates clock pulses corresponding to the signals in 1001. The outputs of logic gates 1316 and 1326 are combined via OR gate 1327 to produce a clock pulse (CLK_PULSE).

In the example shown in FIG. 10 (with the threshold at 25% of the swing level), the logic path flowing through OR gate 1315 generates clock pulses corresponding to the signals in 1000. The logic path flowing through OR gate 1325 generates clock pulses corresponding to the signals in 1001. The outputs of logic gates 1316 and 1326 are combined via OR gate 1327 to produce a clock pulse (CLK_PULSE). If the threshold was at 75% of the swing level, the logic path through 1315 would produce clock pulses corresponding to the signals in 1001 and the logic path through 1325 would produce clock pulses corresponding to the signals in 1000.

Figure 14:
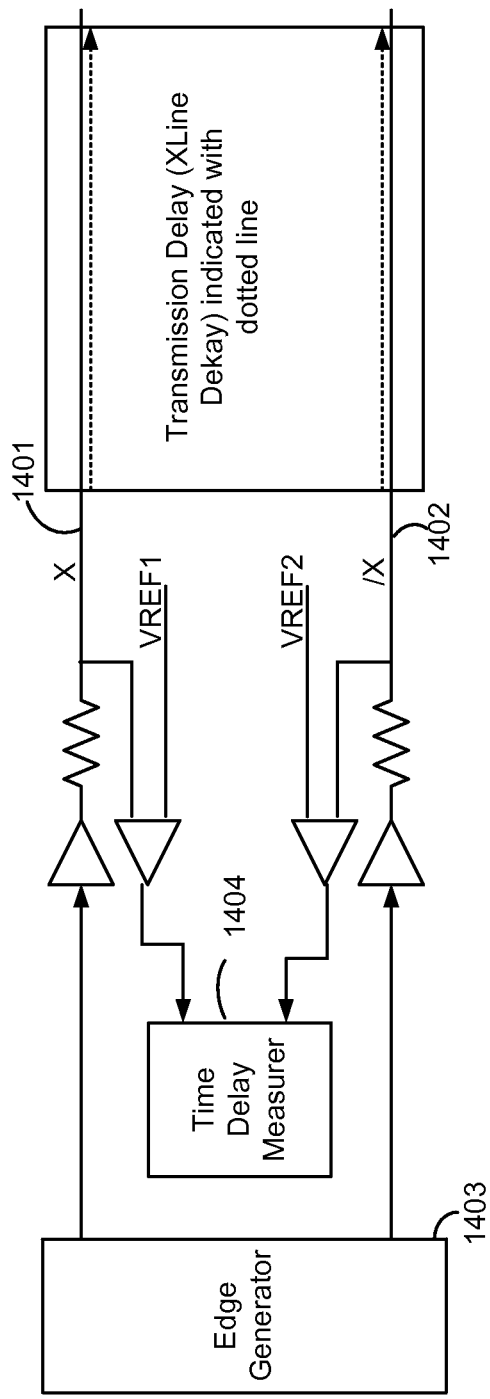
FIG. 14 shows an example implementation of a device for determining propagation delay through transmission lines.

FIG. 14 shows a configuration of transmission lines X and /X that may be used in measuring PD in the manner described above with respect to process 600. According to process 600, a first signal (e.g., X) is provided to a first transmission line (e.g., transmission line 1401), and a second signal (e.g., /X) is provided (601) to a second transmission line (e.g., transmission line 1402). Both are provided by edge generator 1403. Process 600 detects (602) an incident edge on the first transmission line, e.g., by time delay measurer 1404. This may be done, e.g., in the manner described above with respect to graph 501 (FIG. 5). Process 600 detects (603) a reflected edge of the second signal on the second transmission line, e.g., by time delay measurer 1404. This may be done, e.g., in the manner described above with respect to graph 502 (FIG. 5). Process 600 determines (604) a signal propagation delay (e.g., PD) based on a time between detection of the incident edge and detection of the reflected edge. This may be done as explained above with respect to FIGS. 1 to 5.

In the example of FIG. 14, signals other than complementary signals may be input in place of X and /X. If VREF1 and VREF2 have the same values, these signals may be non-complementary. On the other hand, if VREF1 and VREF2 have the same values, then the signals may be complementary.

The functionality described herein, or portions thereof, and its various modifications (hereinafter "the functions"), are not limited to the hardware described herein. All or part of the functions can be implemented, at least in part, via a computer program product, e.g., a computer program tangibly embodied in an information carrier, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the functions can be performed by one or more programmable processors executing one or more computer programs to perform the functions of the calibration process. All or part of the functions can be implemented as, special purpose logic circuitry, e.g., an FPGA and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Components of a computer include a processor for executing instructions and one or more memory devices for storing instructions and data.

Components of different embodiments described herein may be combined to form other embodiments not specifically set forth above. Components may be left out of the structures shown in the figures without adversely affecting its operation. Furthermore, various separate components may be combined into one or more individual components to perform the functions described herein.

In the implementations described herein, delay, where used (e.g., FIGS. 7, 8, 9, 11, 13, etc.), can be produced by circuit elements other than delay elements. For example, an inverter may produce a delay. The delay from such an inverter, from multiple inverters, or from any other appropriate circuit element may be substituted for the actual delay elements in any of the implementations described herein.

Other embodiments not specifically described herein are also within the scope of the following claims.

What is claimed is:

1. A method for obtaining a propagation delay through first and second transmission lines having substantially equal propagation delays, the method comprising:
   providing a first signal to the first transmission line;
   providing a second signal to the second transmission line, the second signal being complementary to the first signal and the second signal being provided to the second transmission line at substantially a same time as the first signal is provided to the first transmission line;
   detecting an incident edge of the first signal on the first transmission line;
   detecting a reflected edge of the second signal on the second transmission line; and
   determining the propagation delay based on times of detection of the incident edge and detection of the reflected edge.

2. The method of claim 1, wherein the incident edge is a first incident edge; and
   wherein the method further comprises:
   triggering a change in state of the first signal in response to the first incident edge;
   detecting a second incident edge of the second signal on the second transmission line;
   triggering a change in state of the first signal in response to the second incident edge;
   detecting a third incident edge of the first signal on the first transmission line; and
   identifying a period between the first incident edge and the second incident edge, the period corresponding to a fixed delay;
   wherein determining the propagation delay is based on a fixed delay.

3. The method of claim 2, wherein the reflected edge is a first reflected edge and the period is a first period; and
   wherein the method further comprises:
   triggering a change in state of the first signal in response to the first reflected edge;
   detecting a second reflected edge of the second signal on the second transmission line;
   triggering a change in state of the first signal in response to the second reflected edge;
   detecting a third reflected edge of the first signal on the first transmission line; and
   identifying a second period between the first reflected edge and the second reflected edge, the second period corresponding to the fixed delay plus a value corresponding to the propagation delay;
   wherein determining the propagation delay is based on the first period and the second period.

4. The method of claim 3, wherein the value corresponding to the signal propagation delay is related to a multiple of the propagation delay; and
   wherein determining the propagation delay based on the first period and the second period comprises:
   obtaining a difference between the first period and the second period; and
   obtaining a quotient of the difference and a constant corresponding to the multiple of the propagation delay.

5. The method of claim 3, wherein detecting the first incident edge comprises comparing the first incident edge to a first threshold, and detecting the second incident edge comprises comparing the second incident edge to the first threshold; and
   wherein detecting the first reflected edge comprises comparing the first reflected edge to a second threshold, and detecting the second reflected edge comprises comparing the second reflected edge to the second threshold.

6. The method of claim 5, wherein the first threshold and the second threshold have different values.

7. The method of claim 5, wherein the first threshold and the second threshold are obtained from a same programmable source.

8. The method of claim 7, wherein the programmable source comprises a DAC.

9. The method of claim 7 wherein a voltage from the programmable source is provided to an FFGA.

10. The method of claim 1, wherein an FPGA performs operations comprising:
providing the first signal to the first transmission line;
providing the second signal to the second transmission line;
detecting the incident edge of the first signal on the first transmission line;
detecting the reflected edge of the second signal on the second transmission line; and
determining the propagation delay based on times of detection of the incident edge and detection of the reflected edge.

11. The method of claim 3, further comprising:
generating clock pulses to trigger changes in state of the first signal.

12. The method of claim 11, wherein generating the clock pulses comprises:
using a first logic path to generate clock pulses to control triggering of the change in state of the first signal in response to the first incident edge and the second incident edge; and
using a second logic path to generate clock pulses to control triggering of the change in state of the first signal in response to the first reflected edge and the second reflected edge;
wherein each of the first and second logic paths receives, as input, the first signal and the second signal; and
wherein output from the first logic path and the second logic path is controlled by a control signal.

13. The method of claim 12, wherein generating the clock pulses comprises:
delaying the first signal to produce a first delayed signal and combining the first delayed signal with the first signal to produce a first clock pulse;
delaying the second signal to produce a second delayed signal and combining the second delayed signal with the second signal to produce a second clock pulse;
outputting, as a first output, a combination of the first clock pulse and the second clock pulse;
delaying an inverted version of the first signal to produce a third delayed signal, and combining the third delayed signal with the inverted version of first signal to produce a third clock pulse;
delaying an inverted version of the second signal to produce a fourth delayed signal and combining the inverted version of second delayed signal with the fourth signal to produce a fourth clock pulse;
outputting, as a second output, a combination of the third clock pulse and the fourth clock pulse;
combining the first output with a first version of a control signal and the second output with a second version of the control signal to produce first and second combined outputs, respectively; and
outputting, as the clock pulse, a logical combination of the first and second combined outputs.

14. The method of claim 11, wherein generating the clock pulses comprises:
delaying the first signal to produce a first delayed signal, and combining the first delayed signal with the first signal to produce a first clock pulse;
delaying the second signal to produce a second delayed signal and combining the second delayed signal with the second signal to produce a second clock pulse; and
outputting, as the clock pulse, a combination of the first clock pulse and the second clock pulse.

15. The method of claim 5, further comprising:
generating clock pulses to trigger changes in state of the first signal;
wherein generating the clock pulses comprises:
using, to generate the clock pulses, a logic path that receives, as input, the first signal, the second signal, the first threshold, and the second threshold, the first threshold and the second threshold controlling whether the clock pulses trigger change in state of the first signal in response to the first incident edge and the second incident edge or the first reflected edge and the second reflected edge.

16. The method of claim 11, wherein generating the clock pulses comprises:
using a multiplexer having control inputs corresponding to the first and second signals to output the clock pulses at times to trigger the changes in state.

17. An apparatus for obtaining a delay through first and second transmission lines having substantially equal delays, the apparatus comprising:
a signal generator (i) for providing a first signal to the first transmission line, and (ii) for providing a second signal to the second transmission line, the second signal being complementary to the first signal and the second signal being provided to the second transmission line at substantiall a same time as the first signal is provided to the first transmission line;
a detector circuit (i) for detecting an incident edge of the first signal on the first transmission line, and (ii) for detecting a reflected edge of the second signal on the second transmission line; and
circuitry for determining the propagation delay based on times of detection of the incident edge and detection of the reflected edge.

18. The apparatus of claim 17, wherein the incident edge is a first incident edge;
wherein the signal generator is configured to trigger a change in state of the first signal in response to the first incident edge;
wherein the detector circuit is configured to detect a second incident edge of the second signal on the second transmission line;
wherein the signal generator is configured to trigger a change in state of the first signal in response to the second incident edge;
wherein determining the propagation delay based on the first period and the second period comprises:
obtaining a difference between the first period and the second period; and
obtaining a quotient of the difference and a constant corresponding to the multiple of the propagation delay.

19. The apparatus of claim 18, wherein the reflected edge is a first reflected edge and the period is a first period;
wherein the signal generator is configured to trigger a change in state of the first signal in response to the first reflected edge;
wherein the detector circuit is configured to detect a second reflected edge of the second signal on the second transmission line;
wherein the signal generator is configured to trigger a change in state of the first signal in response to the second reflected edge;
wherein the detector circuit is configured to detect a third reflected edge of the first signal on the first transmission line; and wherein the circuitry is configured to identify a second period between the first reflected edge and the second reflected edge, the second period corresponding to the fixed delay plus a value corresponding to the propagation delay, where determining the propagation delay is based on the first period and the second period.

20. The apparatus of claim 19, wherein the value corresponding to the signal propagation delay is related to a multiple of the propagation delay; and
wherein determining the propagation delay based on the first period and the second period comprises:
obtaining a difference between the first period and the second period; and
obtaining a quotient of the difference and a constant corresponding to the multiple of the propagation delay.

21. The apparatus of claim 19, wherein detecting the first incident edge comprises comparing the first incident edge to a first threshold, and detecting the second incident edge comprises comparing the second incident edge to the first threshold; and
wherein detecting the first reflected edge comprises comparing the first reflected edge to a second threshold, and detecting the second reflected edge comprises comparing the second reflected edge to the second threshold.

22. The apparatus of claim 21, wherein the first threshold and the second threshold have different values.

23. The apparatus of claim 21, wherein the first threshold and the second threshold are obtained from a same programmable source.

24. The apparatus of claim 22, wherein the programmable source comprises a DAC.

25. The apparatus of claim 24, wherein a voltage from the programmable source is provided to an FPGA.

26. The apparatus of claim 17, wherein the FPGA comprises the signal generator, the detector circuit, and the circuitry for determining the delay.

27. The apparatus of claim 19, further comprising:
a clock generator to generate clock pulses to trigger changes in state of the first signal.

28. The apparatus of claim 27, wherein generating the clock pulses comprises:
using a first logic path to generate clock pulses to control triggering of the change in state of the first signal in response to the first incident edge and the second incident edge; and
using a second logic path to generate clock pulses to control triggering of the change in state of the first signal in response to the first reflected edge and the second reflected edge;
wherein each of the first logic path and the second logic path receives, as input, the first signal and the second signal; and
wherein output from the first logic path and the second logic path is controlled by a control signal.

29. The apparatus of claim 27, wherein generating the clock pulses comprises:
delaying the first signal to produce a first delayed signal, and combining the first delayed signal with the first signal to produce a first clock pulse; and delaying the second signal to produce a second delayed signal and combining the second delayed signal with the second signal to produce a second clock pulse;
outputting, as the clock pulse a combination of the first clock pulse and the second clock pulse.

30. The apparatus of claim 28, wherein generating the clock pulses comprises:

delaying the first signal to produce a first delayed signal, and combining the first delayed signal with the first signal to produce a first clock pulse;
delaying the second signal to produce a second delayed signal and combining the second delayed signal with the second signal to produce a second clock pulse; and
outputting, as the clock pulse a combination of the first clock pulse and the second clock pulse;
delaying an inverted version of the first signal to produce a third delayed signal, and combining the third delayed signal with the inverted version of first signal to produce a third clock pulse;
delaying an inverted version of the second signal to produce a fourth delayed signal and combining the inverted version of second delayed signal with the fourth signal to produce a fourth clock pulse;
outputting, as a second output, a combination of the third clock pulse and the fourth clock pulse;
combining the first output with a first version of a control signal and the second output with a second version of the control signal to produce first and second combined outputs, respectively; and
outputting, as the clock pulse, a logical combination of the first and second combined outputs.

31. The apparatus of claim 21, further comprising:
a clock generator to generate clock pulses to trigger changes in state of the first signal;
wherein generating the clock pulses comprises:
using, to generate the clock pulses, a logic path that receives, as input, the first signal, the second signal, the first threshold, and the second threshold, the first threshold and the second threshold controlling whether the clock pulses trigger change in state of the first signal in response to the first incident edge and the second incident edge or the first reflected edge and the second reflected edge.

32. The apparatus of claim 27, wherein the clock generator comprises a multiplexer having control inputs corresponding to the first and second signals to output the clock pulses at times to trigger the changes in state.

33. A method for obtaining a delay through first and second transmission lines having substantially equal delays, the method comprising:
providing a first signal to the first transmission line;
providing a second signal to the second transmission line the second signal being complementary to the first signal and the second signal being provided to the second transmission line at substantially a same time as the first signal is provided to the first transmission line;
detecting a first edge of the first signal on the first transmission line;
detecting a second edge of the second signal on the second transmission line;
triggering repeated output of the first edge and the second edge at fixed time intervals following detection of the first edge and the second edge, respectively; and
determining a frequency at which the first and second edges are output, the frequency being related to a delay through the first and second transmission lines.

34. An apparatus for obtaining a delay through first and second transmission lines have substantially equal delays, the apparatus comprising:
a signal generator (i) for providing a first signal to the first transmission line, and (ii) for rovidin a second signal to the second transmission line the second signal being complementary to the first signal and the second signal being provided to the second transmission line at substantially a same time as the first signal is provided to the first transmission line;
detector circuitry (i) for detecting a first edge of the first signal on the first transmission line, and (ii) for detecting a second edge of the second signal on the second transmission line;
the signal generator for repeatedly outputting the first edge and the second edge at fixed time intervals following detection of the first edge and the second edge, respectively; and
circuitry for determining a frequency at which the first and second edges are output, the frequency being related to a delay through the first and second transmission lines.

* * * * *

UNITED STATES PATENT AND TRADEMARK OFFICE
CERTIFICATE OF CORRECTION

PATENT NO. : 8,988,081 B2  
APPLICATION NO. : 13/286694  
DATED : March 24, 2015  
INVENTOR(S) : Tushar K. Gohel et al.

It is certified that error appears in the above-identified patent and that said Letters Patent is hereby corrected as shown below:

In the Claims

In column 15, line 4, In Claim 9, delete "FFGA." and insert -- FPGA. --, therefor.

In column 16, line 27-28, In Claim 17, delete "substantiall" and insert -- substantially --, therefor.

In column 16, line 48-53, In Claim 18, delete "wherein determining the propagation delay based on the first period and the second period comprises: obtaining a difference between the first period and the second period; and obtaining a quotient of the difference and a constant corresponding to the multiple of the propagation delay."

and insert -- wherein the detector circuit is configured to detect a third incident edge of the first signal on the first transmission line; and wherein the circuitry is configured to identify a period between the first incident edge and the second incident edge, the period corresponding to a fixed delay, wherein determining the propagation delay is based on a fixed delay. --, therefor.

In column 17, line 63, In Claim 29, delete "pulse;" and insert -- pulse; and --, therefor.

In column 18, line 6, In Claim 30, delete "pulse; and" and insert -- pulse; --, therefor.

In column 18, line 7, In Claim 30, delete "as the clock pulse" and insert -- as a first output, --, therefor.

In column 18, line 46, In Claim 33, delete "line" and insert -- line, --, therefor.

In column 18, line 65, In Claim 34, delete "rovidin" and insert -- providing --, therefor.

In column 18, line 66, In Claim 34, delete "line" and insert -- line, --, therefor.

Signed and Sealed this  
Twenty-fifth Day of August, 2015

Michelle K. Lee  
*Director of the United States Patent and Trademark Office*